United States Patent
Bautista, Sr. et al.

(10) Patent No.: US 9,894,820 B1
(45) Date of Patent: Feb. 13, 2018

(54) SMT DIMM CONNECTOR AUTO SAFE REMOVE NOZZLE

(71) Applicant: Flextronics AP, LLC, Broomfield, CO (US)

(72) Inventors: Virgilio Encabo Bautista, Sr., Cebu (PH); William Uy, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 278 days.

(21) Appl. No.: 14/609,139

(22) Filed: Jan. 29, 2015

(51) Int. Cl.
*H05K 13/04* (2006.01)
*B23K 1/018* (2006.01)

(52) U.S. Cl.
CPC ......... *H05K 13/0486* (2013.01); *B23K 1/018* (2013.01)

(58) Field of Classification Search
CPC .......................... H05K 13/0486; B23K 1/018
See application file for complete search history.

(56) References Cited

U.S. PATENT DOCUMENTS

| | | | |
|---|---|---|---|
| 3,952,920 A | 4/1976 | Bergman | |
| 4,356,619 A | 11/1982 | Snyder | |
| 4,668,097 A | 5/1987 | Nygren | |
| 4,691,419 A | 9/1987 | Keeler | |
| 4,726,114 A | 2/1988 | Staviski | |
| 4,835,401 A | 5/1989 | Sajiki | |
| 4,913,353 A | 4/1990 | Falco | |
| 5,062,201 A * | 11/1991 | Long, Jr. | H05K 13/0491 29/741 |
| 5,348,585 A | 9/1994 | Weston | |
| 5,560,531 A * | 10/1996 | Ruszowski | B23K 1/008 228/19 |
| 5,921,836 A | 7/1999 | Nanto | |
| 6,494,245 B1 | 12/2002 | Simone | |
| 8,444,025 B2 | 5/2013 | Greter | |
| 2003/0089731 A1 | 5/2003 | Mayer | |
| 2003/0164077 A1 | 9/2003 | Hill | |
| 2004/0081759 A1 | 4/2004 | Maruyama | |
| 2004/0134619 A1 | 7/2004 | Kojima | |
| 2005/0214172 A1 | 9/2005 | Burgisser | |
| 2007/0090128 A1 | 4/2007 | Martin | |
| 2009/0008246 A1 | 1/2009 | Reynolds | |
| 2015/0266224 A1 | 9/2015 | Bregonzio | |
| 2015/0359149 A1 | 12/2015 | Itoh | |

FOREIGN PATENT DOCUMENTS

JP          H06-8032 B2       2/1994

* cited by examiner

*Primary Examiner* — John C Hong
(74) *Attorney, Agent, or Firm* — Haverstock & Owens LLP

(57) ABSTRACT

Methods of and devices for removing SMT DDR DIMM connectors are provided. The devices are configured to remove long SMT DDR DIMM connectors softly and automatically, including DDR 3 and DDR 4 DIMM connectors. In the event when any solder is not melted, the device comprises a release mechanism to automatically release the connectors, such that damages to the connector can be avoided.

9 Claims, 6 Drawing Sheets

SMT DIMM CONNECTOR AUTO SAFE REMOVE NOZZLE

FIELD OF THE INVENTION

The present invention relates to the field of computers. More specifically, the present invention relates to memory connectors removing processes and devices.

BACKGROUND OF THE INVENTION

Typical methods of removing memory connectors can result in damages and become scrap due to potential internal solder crack or PCB (printed circuit board) copper trace crack. The typical methods often involve manual removal of the memory connectors.

SUMMARY OF THE INVENTION

Methods of and devices for removing SMT DDR DIMM connectors are provided. (SMT refers to Surface Mount Technology, DDR refers to Double Date Rate, and DIMM refers to Dual In-line Memory Module). The devices and methods provided herein can be used to remove a long stripe of SMT DDR DIMM connectors softly and automatically, including DDR 3 and DDR 4 DIMM connectors.

The devices and methods disclosed herein ensure the integrity and reliability of the PCB copper pads in a connector removal process in the event that some or most of the solders do not reach the liquid state. Accordingly, the devices and methods can be used to prevent the memory connectors from damage resulting in damage that would require the device to be scrapped.

In an aspect, a memory connector removing device comprises a heating member and a connector removing member configured to release a connector when an amount of solder is not melted. In some embodiments, the connector removing member comprises a spring sheet clamp. In other embodiments, the spring sheet clamp is configured to release the connector when a first holding force between the solder and a PCB is greater than a second holding force of the spring sheet clamp. In some other embodiments, the second holding force is less than 1 newton. In some embodiments, the second holding force is between 0.1 and 0.6 newton. In other embodiments, the heating member comprises a reflow nozzle. In some other embodiments, the reflow nozzle is configured to heat the solder to above the melting point of the solder. In some embodiments, the connector comprises a memory connector. In other embodiments, the memory connector comprises SMT DDR3 or DDR4 DIMM connectors.

In another aspect, a method of removing a memory connector comprises heating a memory connector, applying a force by a connector removing member to remove the memory connector from a PCB board, and releasing the memory connector from the connector removing member when an amount of solder on the memory connector remains solid. In some embodiments, the method further comprises pre-heating. In other embodiments, the heating comprises reflowing. In some other embodiments, the method further comprises removing the memory connector away from the PCB board. In some embodiments, the method further comprises un-locking one or more pins. In some other embodiments, the force is smaller than a holding force of the solder in a not melted status. In some embodiments, the force is greater than a holding force of the solder in a liquid phase. In other embodiments, the force is less than 1 newton.

In another aspect, a method of removing a memory connector from a PCB comprises heating solders for a predetermined duration, applying an upward force to remove the memory connector from the PCB, and separating the memory connector from the PCB when substantial all or all of the solder in a liquid state. In some embodiments, the upward force is applied through a spring sheet clamp. In other embodiments, the spring sheet clamp is configured to release the memory connector if one of the solder is not melted.

Other features and advantages of the present invention will become apparent after reviewing the detailed description of the embodiments set forth below.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

DETAILED DESCRIPTION OF THE PREFERRED EMBODIMENT

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 1A:
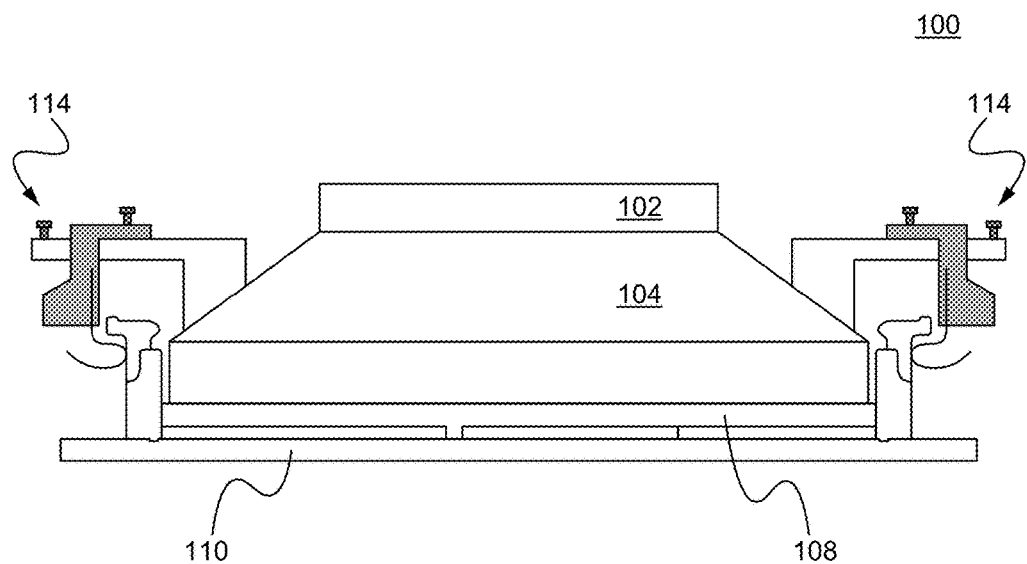
FIG. 1A illustrates that the device 100 is in a heating mode, which can include a preheating process and a reflowing process.
Figure 1B:
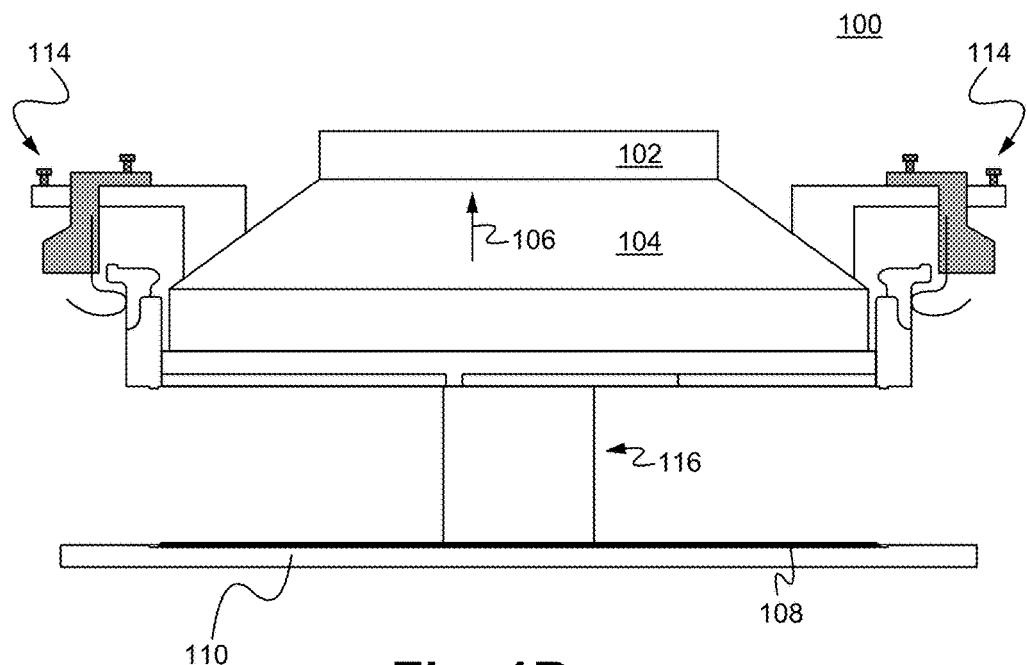
FIG. 1B illustrates that the device 100 is in a removing mode, which shows that the memory connector 108 is successfully removed from the PCB 110.
Figure 1C:
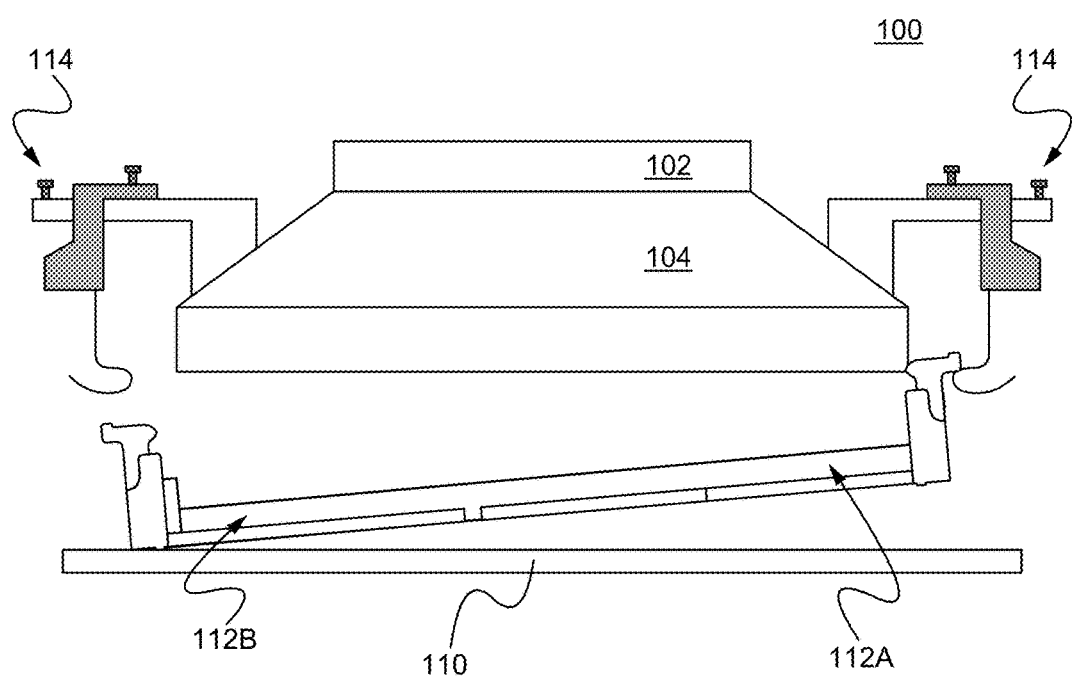
FIG. 1C illustrates an incomplete melting process that the device drops the memory connector 108 automatically in accordance with some embodiments of the present invention.

FIGS. 1A, 1B, and 1C illustrate a memory connector removing device 100 in accordance with some embodiments of the present invention. FIG. 1A illustrates that the device 100 is in a heating mode, which can include a preheating process and a reflowing process. In some embodiments, the device 100 comprises a heating member 104 and clamping member 114 mechanically couple with a base 102. In the heating mode, the heating member generates heat to heat the memory connector 108 either by conduction or hot air flow. In some embodiments, the temperature generated at the heating member 104 is higher than a melting temperature of the solder on the memory connector 108. The clamping member 114 comprises clamping and/or locking structure to immobilize the memory connector 108 for moving and transporting. In some embodiments, the clamping member 114 comprises a spring sheet clamp, which is constructed allowing the memory connector 108 sliding out when an amount of solder on one or more of the pins on the memory connectors is not melt. In some embodiments, the spring sheet clamp provide a holding force to clamp and move/remove the memory connector 108. The holding force of the spring sheet clamp is set/configured to be weaker than the strength of the unmelted solder adhering to the PCB, such that the spring sheet clamp releases the memory connector when an amount of the solder are not melt or not turning into a liquid state by the heating process through the heating member 104.

In operation, the heating member 104 heats the memory connector for a pre-determined time, such as 30 second, at a predetermined temperature, such as 10° C. above the melting point of the solder. The base 102 of the device 100 comprises a moving member 116, such as linear stage, (FIG. 1B) to move the heating member 104 up in a direction 106 perpendicular to the PCB when the heating process is done. In the event when an amount of the solder is not melted, the memory connector 108 slides out from the clamping member 114 preventing damage to the memory connecter and/or the PCB board.

FIG. 1B illustrates that the device 100 is in a removing mode, which shows that the memory connector 108 is successfully removed from the PCB 110. This is one of the examples that all or substantially all of the solder on the memory connector 108 is melted, such that no solder-to-PCB attachment overcomes the clamping force at the clamping member 114.

FIG. 1C illustrates an incomplete melting process that the device drops the memory connector 108 automatically in accordance with some embodiments of the present invention. The left side portion 112B of the memory connector 108 is not melted or not fully melted, such that the force/strength of the solder to hold on the memory connector is greater than the holding force of the clamping member 114. After dropping the left side portion 112B of the memory connector, the right side portion 112A of the memory connector slid out/dropped from the clamping member 114.

Figure 2:
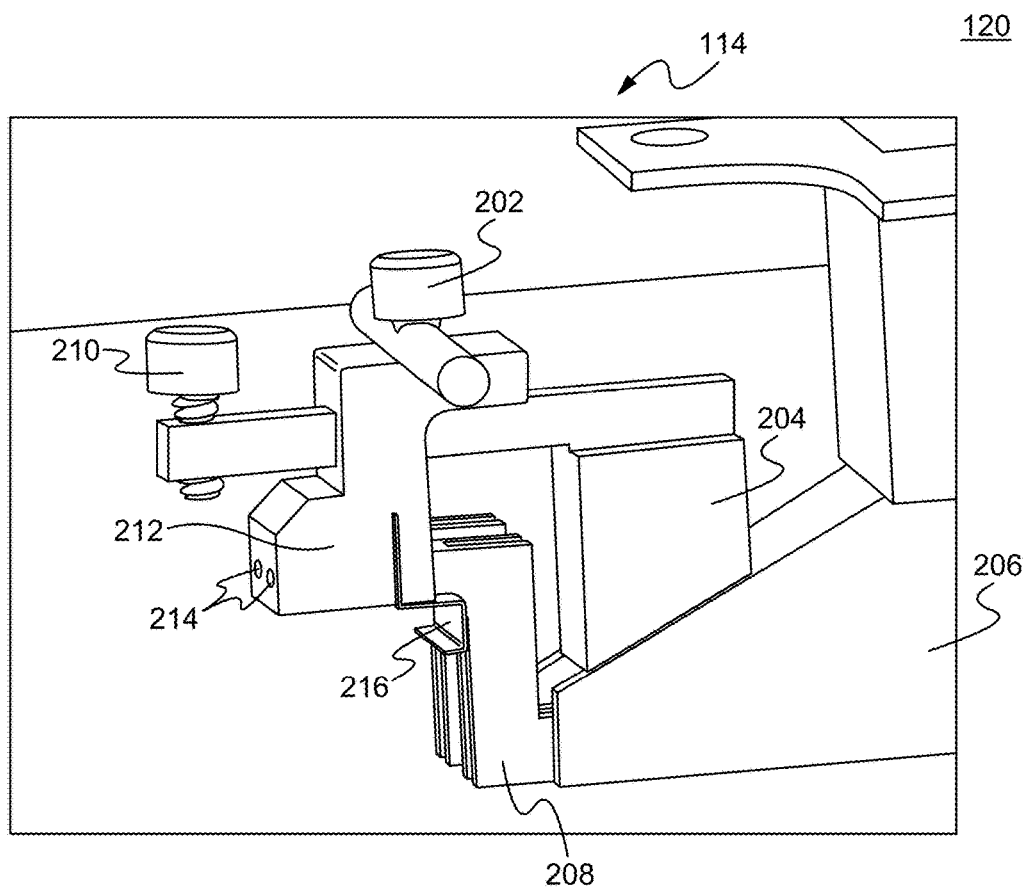
FIG. 2 illustrates a blow up view of the left side portion of the clamping member 114 of FIGS. 1A-1C.

FIG. 2 illustrates a blow up view of the left side portion of the clamping member 114 of FIGS. 1A-1C. The right side portion of the clamping member 114 can be similar or different in construction and function to the left side portion of the clamping member 114. In some embodiments, the clamping member 114 comprises a clamping lock 202, a clamping bracket 204, a reflow nozzle 206, a DIMM connector 208, a safety lock 210, a spring sheet holder 212, set screws 214, and a spring clamp 216. The reflow nozzle is used to provide heat like the heating member 104 to melt the solder on the memory connector 108. The spring sheet clamp 216 is constructed to slide out in the event when an amount of solder does not melt. The holding/carrying force of the spring sheet clamp 216 is weaker than the adhesion force of the solder and PCB pad. In the case of fully melting of the solders, the spring sheet clamp 216 is able to pull-up the entire memory connect 108 as a successful removal.

Figure 3:
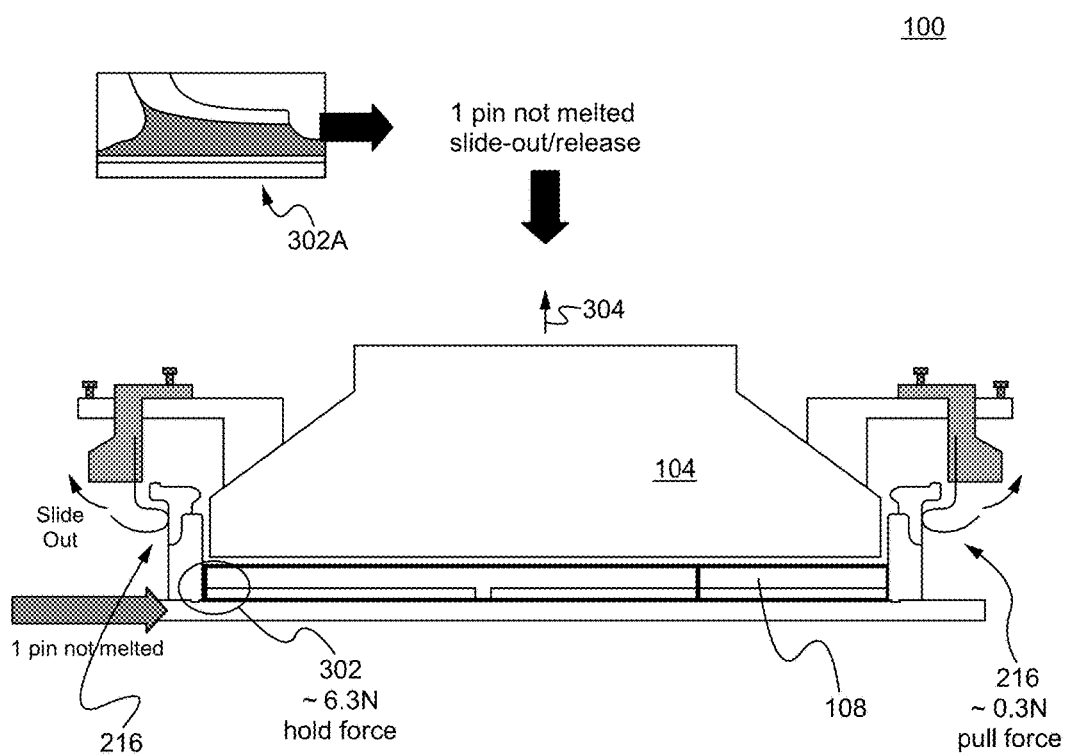
FIG. 3 illustrates the memory connector 108 sliding out mechanism in accordance with some embodiments of the present invention.

FIG. 3 illustrates the memory connector 108 sliding out mechanism in accordance with some embodiments of the present invention. After a predetermined duration of heating by the heating member 104 of the device 100, the device 100 is moving in a direction 304 perpendicular to the PCB. In this example, the solder of the one of the pins 302 (the exploded view 302A) is not melted. The holding force of the un-melted solder can be around 6.3 N (Newton). In some embodiments, the pulling force generated by the device 100 is about 0.3N. When a force (the un-melted solder force) is greater than the pulling force, a spring sheet clamp 216 slides out/release the memory connecter.

Figure 4:
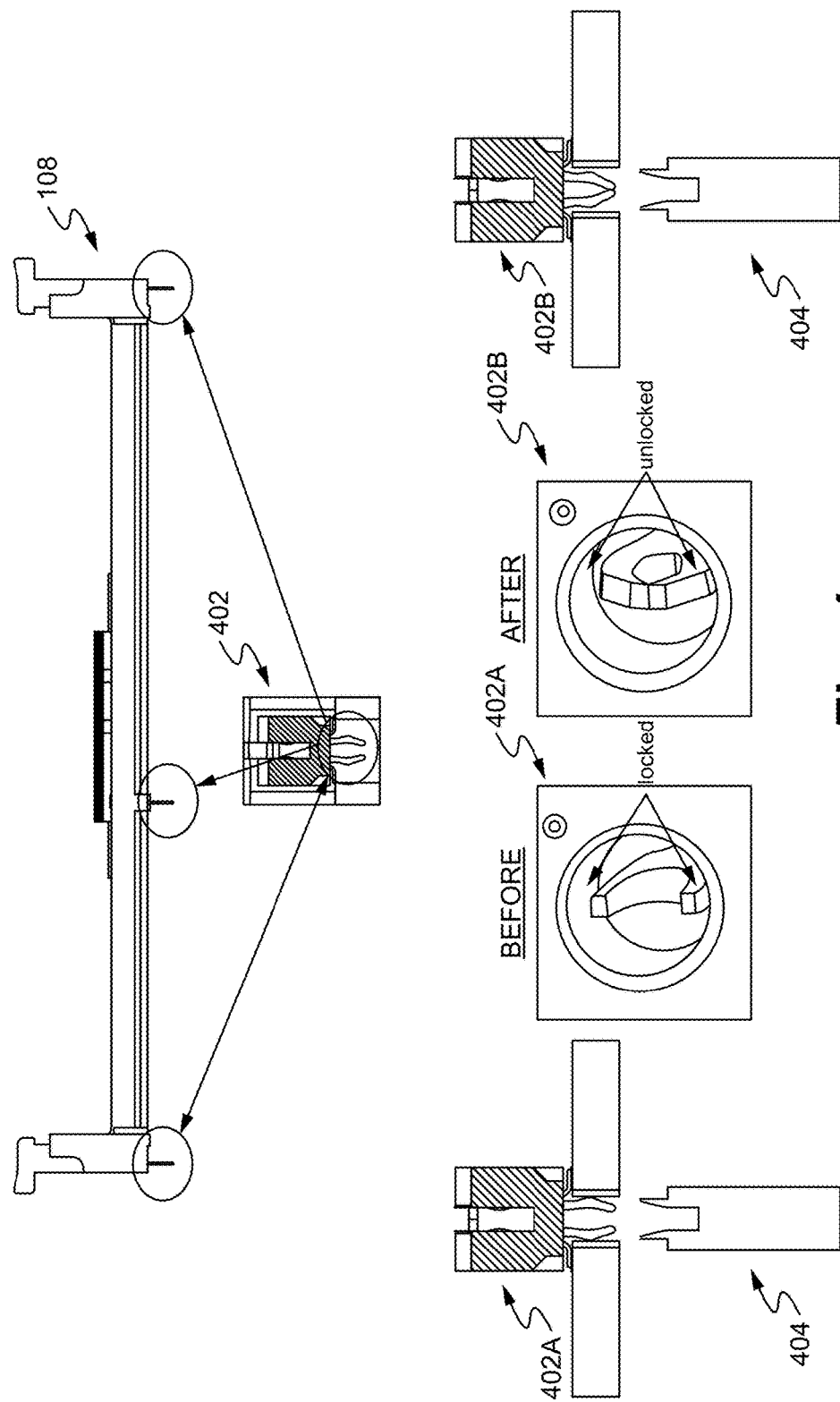
FIG. 4 illustrates an unlocking step as part of the memory connector removing process in accordance with some embodiments of the present invention.

FIG. 4 illustrates an unlocking step as part of the memory connector removing process in accordance with some embodiments of the present invention. In some embodiments, the memory connector 108 comprises 3 pins that are locked to the PCB. The device 100 (FIGS. 1A-1C) is able to unlock the three pins before a heating process, such as heating by a hot gas. The pin unlocking comprises using a unlocking device 404 with complimentary structure pushing to mate and unlock the pins 402. The pins 402 is changed from a locking state 402A to become an unlocked state 402B.

Figure 5:
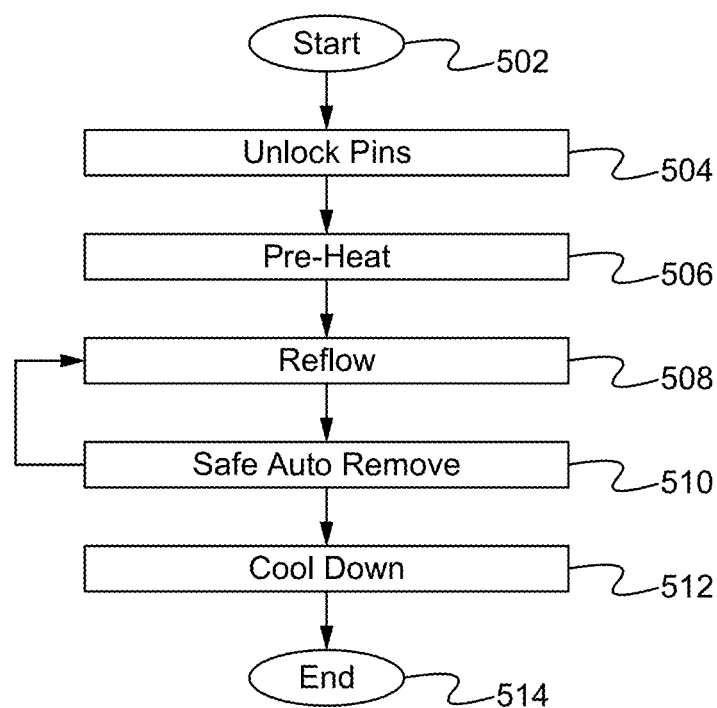
FIG. 5 is a flow chart illustrating a memory connector removing method 500 in accordance with some embodiments of the present invention.

FIG. 5 is a flow chart illustrating a memory connector removing method 500 in accordance with some embodiments of the present invention. The process can begin at Step 502. At Step 504, the pins on the memory connector are unlocked. At Step 506, pre-heating is performed. At Step 508, reflowing is performed. In some embodiments, the reflowing is performed at a temperature above the melting point temperature of the solder. At Step 510, automatically removing is performed. When the solders is melted to a liquid state, the process goes to a Step 512 for cooling down. If the solder is not melted, the Step 510 goes back to reflowing Step 508. The method 500 can stop at Step 514.

The devices and methods disclosed herein can be utilized to automatically remove the memory connectors, which provide advantageous aspects including a fully automatic process for pulling up and/or removing the DIMM connectors for rework without human intervention. Further, the process also ensures that all the solders are fully melted before it can be removed. Furthermore, the method ensures that the temperature has reached the melting point of the solder, which ensures a high curing quality for the succeeding reflowing process.

In operation, a heat is applied to the memory connector and a clamping with a release mechanism is used to remove/lift the memory connector. In the case when all the solder is melted, the memory connector can be successful lifted by the clamp. In the case when there are solder is not melted or in a liquid state, the holding force of the solder that is stronger than the force of the clamp causes the memory connector to be released from the clamp preventing damage to the memory connector.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. A method of removing a memory connector comprising:
   a) heating a memory connector;
   b) applying a force by a connector removing member to remove the memory connector from a PCB board; and
   c) releasing the memory connector from the connector removing member when an amount of solder on the memory connector remains solid.

2. The method of claim 1, further comprising pre-heating.

3. The method of claim 1, wherein the heating comprises reflowing.

4. The method of claim 1, further comprising removing the memory connector away from the PCB board.

5. The method of claim 1, further comprising un-locking one or more pins.

6. The method of claim 1, wherein the force is smaller than a holding force of the solder in a not melted state.

7. The method of claim 1, wherein the force is greater than a holding force of the solder in a liquid phase.

8. The method of claim 1, wherein the force is less than 1 newton.

9. A method of removing a memory connector from a PCB comprising:
   a) heating solders for a predetermined duration;
   b) applying a upward force to remove the memory connector from the PCB; and
   c) separating the memory connector from the PCB only when substantially all or all of the solder in a liquid state, wherein the upward force is applied through a spring sheet clamp, wherein the spring sheet clamp is configured to release the memory connector when one of the solder is not melted.

* * * * *